(12) United States Patent
Baseman et al.

(10) Patent No.: US 8,328,950 B2
(45) Date of Patent: Dec. 11, 2012

(54) FOREIGN MATERIAL CONTAMINATION DETECTION

(75) Inventors: Robert J. Baseman, Brewster, NY (US); Tomasz J. Nowicki, Fort Montgomery, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 12/783,702

(22) Filed: May 20, 2010

(65) Prior Publication Data
US 2011/0284029 A1    Nov. 24, 2011

(51) Int. Cl.
*B08B 7/04* (2006.01)

(52) U.S. Cl. ............ 134/18; 134/42; 134/56 R; 436/43; 436/164; 700/108; 700/109; 700/174; 700/175; 700/177

(58) Field of Classification Search .................. 134/18, 134/42; 436/43, 164; 700/108, 109, 174, 700/175, 177
See application file for complete search history.

(56) References Cited

U.S. PATENT DOCUMENTS

| | | | |
|---|---|---|---|
| 6,197,123 B1 * | 3/2001 | Poag et al. | 134/18 |
| 7,640,072 B2 * | 12/2009 | Shimizu et al. | 700/121 |
| 2003/0159715 A1 * | 8/2003 | Scanlan et al. | 134/18 |
| 2004/0261815 A1 * | 12/2004 | Pavone | 134/1.3 |

OTHER PUBLICATIONS

Horton, N. J., et al., "Maximum Likelihood Analysis of Generalized Linear Models with Missing Covariates", Statistical Methods in Medical Research, 1998, 8, pp. 37-50.

* cited by examiner

*Primary Examiner* — Bibi Carrillo
(74) *Attorney, Agent, or Firm* — Scully, Scott, Murphy & Presser, P.C; Daniel P. Morris, Esq.

(57) ABSTRACT

There are provided a system, method and computer program product for detecting foreign materials in a semiconductor manufacturing process. The manufacturing process uses a plurality of semiconductor manufacturing tools. The system categorizes at least one monitoring wafer according to one or more categories. The system supplies the categorized monitoring wafer to a semiconductor manufacturing tool. The system observes a level of contamination on the categorized monitoring wafer. The system compares the level of contamination to a threshold. The system cleans the tool in a response to determining that the level of contamination is larger than the threshold. The system determines which category of the wafer leaves a highest level of contamination on the tool. The system identifies a root cause of the highest level of contamination on the tool.

25 Claims, 3 Drawing Sheets

FOREIGN MATERIAL CONTAMINATION DETECTION

BACKGROUND

The present application generally relates to manufacturing semiconductor products. More particularly, the present application relates to detecting foreign materials in a semiconductor manufacturing process.

A semiconductor product includes, but is not limited to a semiconductor chip, a semiconductor wafer and a semiconductor wafer lot. In a course of manufacturing a semiconductor product, including fabrication of high end microprocessors in a semiconductor fabrication facility, defects are detected, e.g., by semiconductor testers (e.g., tester model J973EP available from Teradyne®, Inc., etc.) which are due to the contamination of the semiconductor product by foreign materials or particles. A foreign material/particle refers to a material/particle that does not originate from a microcircuit and/or from any semiconductor material that is deposited with the microcircuit or that originates from the semiconductor material but in a way which was not expected during an ideal technological process. A foreign material/particle includes, but is not limited to, a human hair, dust, a piece of a boundary of a silicon wafer which was detached due to an overheating (chaffing), etc. Depending on size, location, and nature, these foreign particles can render a semiconductor product completely non functional. As microelectronic features decrease in size and feature densities increase, semiconductor products become more sensitive to contamination (e.g., foreign particles), and an effective reduction of the contamination is a requirement for achieving and maintaining high manufacturing yields.

Foreign particles may be generated in a course of many individual semiconductor product manufacturing operations, e.g., reactive ion etching and chemical vapor deposition. For instance, poorly designed reactive ion etch chambers may lead to extensive foreign particle deposition. Poorly controlled chamber evacuation steps may support condensation of gas phase species and subsequent foreign particle deposition in CVD (Chemical Vapor Deposition) reactors and RIE (Reactive Ion Etching) chambers. Semiconductor manufacturing process and tool design have at least one common objective: minimizing the number and size of foreign particles.

A deposition and adhesion of the foreign particles to a surface of a semiconductor product may be resulted from chemical and/or physical steps in a semiconductor manufacturing process. Thus, a reduction of the deposition and adhesion is another objective of semiconductor manufacturing process and tool design. In most cases, semiconductor products are inspected periodically for a contamination and especially following a completion of manufacturing processes known to be susceptible to foreign particle generation and/or deposition. However, in some cases, foreign particles detected on semiconductor products are not generated during a process immediately prior to the inspection. In these cases, foreign particles may be generated and deposited on semiconductor products upstream, perhaps far upstream from the inspection step. During subsequent handling or processing, foreign particles may be released from a semiconductor product, potentially contaminating a chamber and semiconductor products subsequently processed in that chamber.

Contamination measurements (i.e., the number of foreign particles on a wafer) influence a variety of actions in a semiconductor manufacturing environment. Contamination measurements are used to verify a quality of semiconductor processes and products. When unacceptable levels of contamination (e.g., the number of foreign particle is larger than a threshold) are detected, a variety of remedial measures addressing semiconductor products, chambers, or processes may be considered. For example, individual wafers or lots of wafers may be cleaned or reworked. Processing chambers may be cleaned or parts replaced. Chemical or physical elements of processes may be redesigned.

However, an effective identification and implementation of remedial measures requires a credible identification of the source of contamination, which has been difficult in a traditional solution. Thus, it is desirable to implement a model which will point to a semiconductor manufacturing step or tool, prior to an inspection of a semiconductor manufacturing tool and/or step, which is most likely the cause of the contamination.

SUMMARY OF THE INVENTION

The present disclosure describes a system, method and computer program product for detecting foreign particles in a semiconductor manufacturing process and identifying a root cause of the foreign particle.

In one embodiment, there is provided a system for detecting foreign particles in a semiconductor manufacturing process. The manufacturing process uses a plurality of semiconductor manufacturing tools. The system comprises a memory device and a processor connected to the memory device. The processor categorizes at least one monitoring wafer according to one or more categories. The processor supplies the categorized monitoring wafer to a semiconductor manufacturing tool. The processor observes a level of contamination on the categorized monitoring wafer. The processor compares the level of contamination to a threshold. The processor cleans the tool in a response to determining that the level of contamination is larger than the threshold. The processor determines which category of the categorized monitoring wafer leaves a highest level of contamination on the tool. The processor identifies a root cause of the highest level of contamination on the tool based on the determined category.

In a further embodiment, the determining the highest contamination category includes solving best fit problems.

In a further embodiment, a solution of the best fit problems classifies parameters of the level of contamination of the tool.

In a further embodiment, to identify the root cause of the highest level of contamination on the tool, the processor searches for a category with the highest level of contamination in a dramatic circumstance. The processor observes a change in a category with an average level of contamination in a usual circumstance. The processor distributes new monitoring wafers in the category with the highest level of contamination, or in the category with the average level of contamination, or in both categories.

BRIEF DESCRIPTION OF THE DRAWINGS

The accompanying drawings are included to provide a further understanding of the present invention, and are incorporated in and constitute a part of this specification.

DETAILED DESCRIPTION

Figure 1:
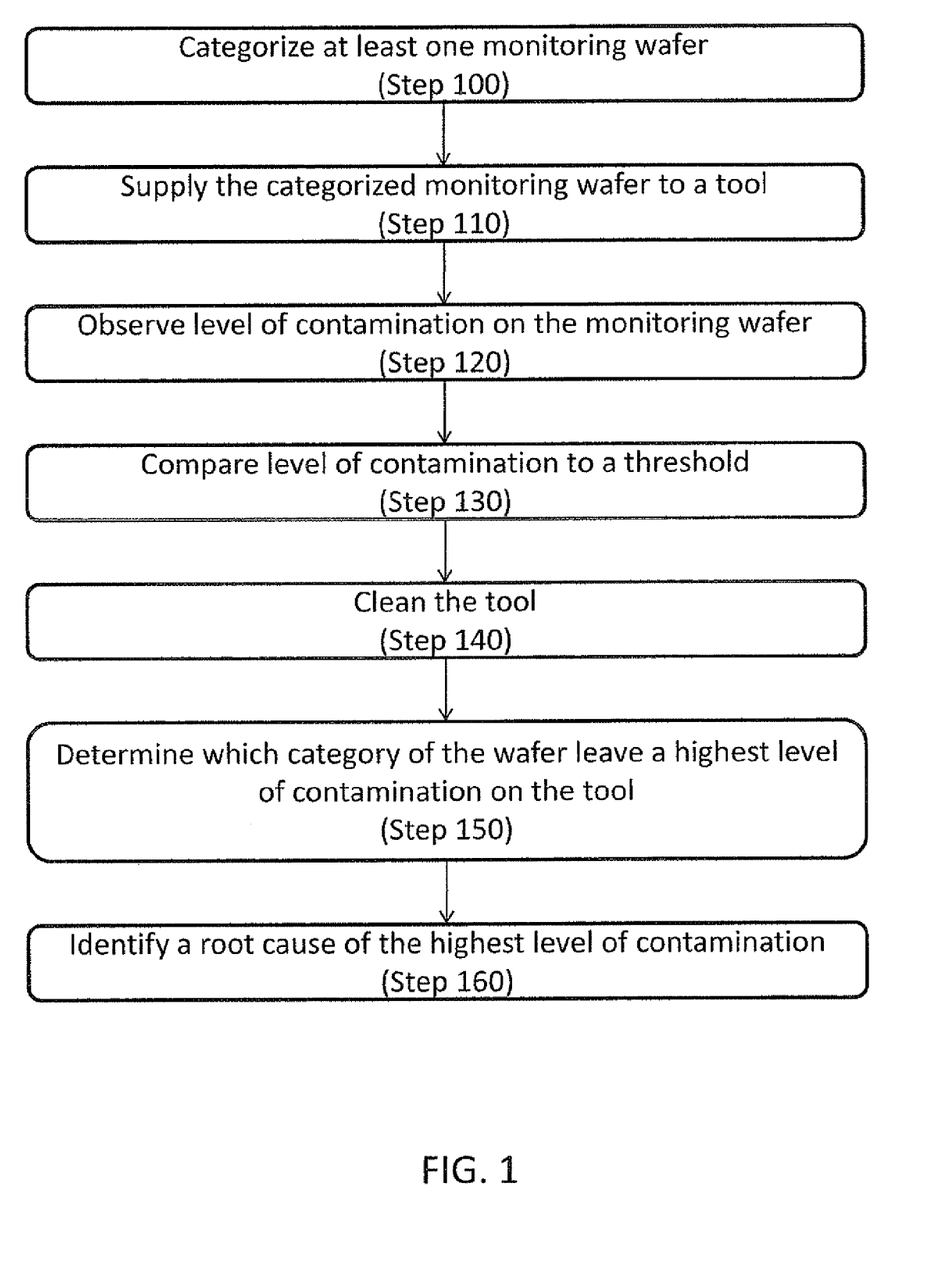
FIG. 1 illustrates a flow chart describing method steps for detecting foreign materials in a semiconductor manufacturing process including a plurality of semiconductor manufacturing tools in one embodiment.

FIG. 1 illustrates a flow chart of method steps for detecting foreign materials/particles in a semiconductor manufacturing process in one embodiment. The semiconductor manufacturing process includes a plurality of semiconductor manufacturing tools. In one embodiment, a computing system (e.g., a computing system 300 illustrated in FIG. 3) including at least one processor (e.g., a processor 311 in FIG. 3) and at least one memory device (e.g., a Random Access Memory 314 in FIG. 3) performs the method steps illustrated in FIG. 1. At step 100, the computing system categorizes a plurality of monitoring wafers. In one embodiment, the computing system determines a category of a monitoring wafer according to semiconductor manufacturing tools used to manufacture that monitor wafer. For example, a memory device and a microprocessor device may use different manufacturing tools. At step 100, the computing system may receive, e.g., from a database (not shown), data that describes how each wafer is manufactured, e.g., which semiconductor manufacturing tools and/or steps are going to be used. A monitoring wafer is a wafer used to evaluate a status of a semiconductor manufacturing tool or a group of semiconductor manufacturing tools. Monitor wafers are introduced to a technological semiconductor production line as a standard procedure at predetermined circumstances (e.g., at given time moments) or as a response to some particular circumstances (e.g., due to results of some tests on wafers done later in semiconductor manufacturing tools/steps). A status variation on the monitoring wafer is a level of contamination.

At step 110, the computing system supplies at least one categorized monitoring wafer to a semiconductor manufacturing tool and/or chamber (e.g., Thin Films Equipment, Diffusion Equipment, etc.). At step 120, the computing system observes a level of contamination on the categorized monitoring wafer, e.g., through sensors and/or detectors attached on the tools and/or chambers. In one embodiment, the level of contamination (e.g., the number of foreign particles) on the monitoring wafer represents the number of foreign particles in the semiconductor manufacturing tool and/or chamber. In one embodiment, the computing system observes the number of foreign particles on the monitoring wafer, e.g., through the sensors and/or detectors. In another embodiment, a user monitors or observes the number of foreign particles on the monitoring wafer, e.g., through microscope. In a further embodiment, the computing system models the level of contamination on the semiconductor manufacturing tool and/or chamber, e.g., by using at least one statistical distribution. A statistical distribution includes, but is not limited to Poisson distribution, Bernoulli distribution. This modeling is described in detail below.

Returning to FIG. 1, at step 130, the computing system compares the level of contamination on the monitoring wafer to a threshold (e.g., 50 foreign particles on the wafer). At step 140, if the level of contamination of larger than the threshold, the computing system initiates cleaning of the semiconductor manufacturing tool and/or chamber, e.g., by an automated and/or manual cleaning process. At step 150, the computing system determines which category of monitoring wafers leaves a highest level of contamination in the semiconductor tool and/or chamber. In one embodiment, to determine the highest contamination category, the computing system solves a "best fit" type problem. The "best fit" type problem includes one or more of: Least Square method and Maximum Likelihood method. The "best fit" type problem classifies parameters (e.g., mean values) of the level of contamination of the semiconductor manufacturing tool and/or chamber. Both Least Square method ("LS") and Maximum Likelihood method ("ML") are statistical methods to find best estimators for parameters of a probability distribution, e.g., Poisson distribution. Given observations of contamination on monitoring wafers and given a variety of paths through a semiconductor fabrication facility and through semiconductor manufacturing tools used in the fabrication of the monitoring wafers and using a particular model (e.g., formula (1) and (2), etc. described below) of a statistical distribution, LS and/or ML is used to estimate a rate of contamination due to each semiconductor manufacturing tool. LS and ML are described in more detail below.

Figure 2:
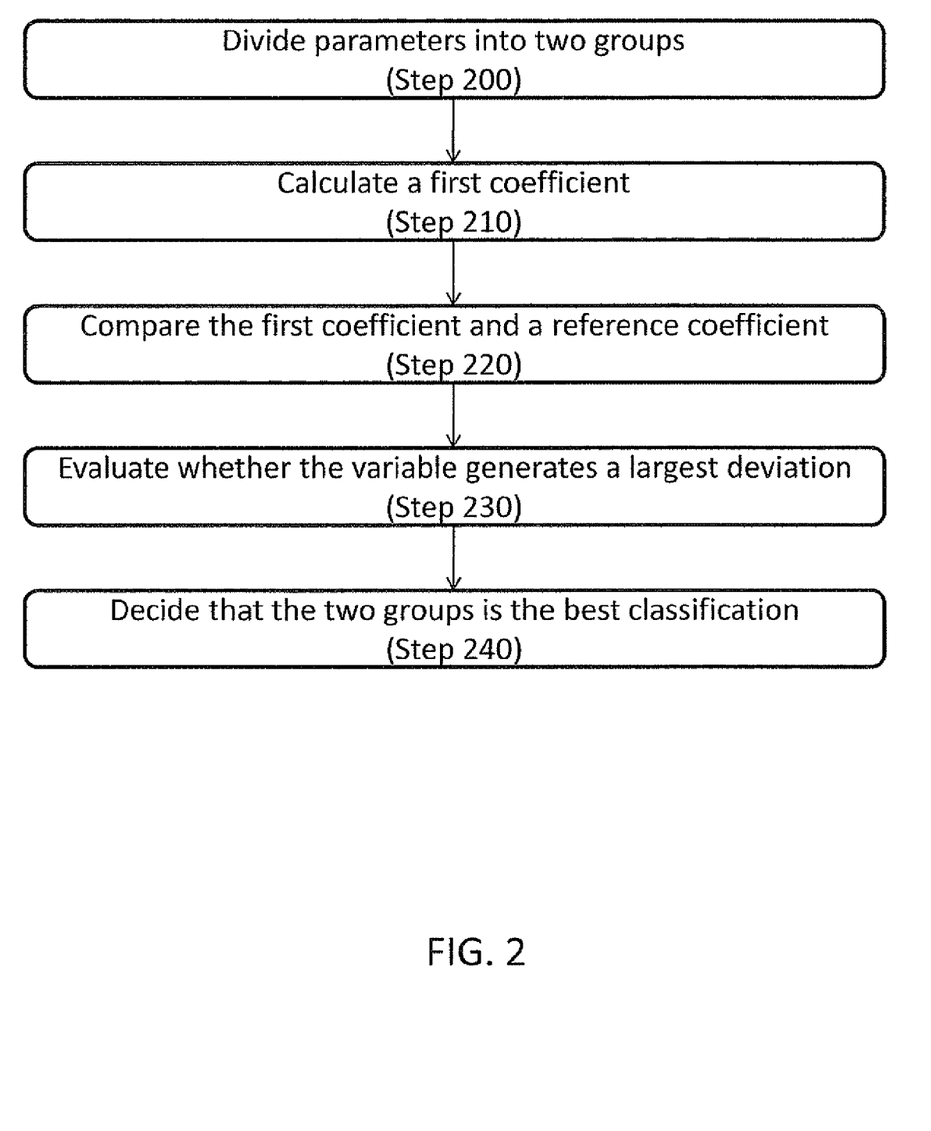
FIG. 2 illustrates a flow chart describing method steps for classifying parameters in one embodiment.

FIG. 2 illustrates a flow chart describing method steps for classifying parameters of contamination of semiconductor manufacturing tools/chamber and/or of monitoring wafers in one embodiment. To classify the parameters, at step 200, the computing system divides the parameters into two groups according to a variable index. The computing system may order the parameters in an order and divides the ordered parameters into, for example, two groups according to a variable index k. For example, for exemplary parameters $\lambda_1, \lambda_2, \ldots, \lambda_N$, the computer system splits these parameters into two groups, the first group $\lambda_L = \{\lambda_1, \lambda_2, \ldots, \lambda_k\}$ and the second group $\lambda_U = \{\lambda_{k+1}, \lambda_{k+2}, \ldots, \lambda_N\}$, where k is a (variable) index between 1 and N. At step 210, the computing system calculates a first coefficient based on the (variable) index k and the number of parameters N. For example, the computing system calculates the first coefficient, e.g., by computing $$\frac{k \cdot (N-k)}{N \cdot N} \cdot \frac{(E\lambda_U - E\lambda_L)^2}{D^2 \lambda}$$

where $E\lambda_U$ is an expected value (mean) of the second group, $E\lambda_L$ is a an expected value (mean) of the first group, $D^2\lambda$ refers to a variance (square of standard deviation) of the whole group of $\lambda$'s. At step 220, the computing system compares the first coefficient with a reference coefficient (e.g., a coefficient from a normal (Gaussian) distribution). At step 230, the computing system evaluates whether the (variable) index k generates the largest deviation (i.e., largest difference) between the first coefficient and the reference coefficient. In other words, the computing system looks for the (variable) index k which generates the largest deviation between the first coefficient and the reference coefficient. At step 240, upon finding the (variable) index k which generates the largest deviation, the computing system decides that the two groups split by the (variable) index k is the best classification of the parameters. The first coefficient is a normalized distance between two different groups. If the first coefficient is similar to a distance calculated for a sample from the normal distribution, then the groups are not separated. If the first coefficient is larger, then computing system considers the groups to be separated. The largest deviation from the reference coefficient shows a "best" separation point—a group below $\lambda_k$ is "regular," e.g., there may be no contamination on the group. A group above $\lambda_k$ is "high," e.g., there may be contamination on the group. Among "high" groups (histories), there are common semiconductor manufacturing tools/ steps, which are prime suspects for the contamination.

Returning to FIG. 1, at step 160, the computing system identifies a root cause (i.e., main cause) of the highest level of contamination on the semiconductor tool/chamber and/or the monitoring wafer. In one embodiment, to identify the root cause, the computing system searches for a category of monitoring wafers with the highest level of contamination in a dramatic circumstance. A dramatic circumstance refers to a situation where numerous abnormal errors arise in a semiconductor manufacturing process. In another embodiment, to identify the root cause, the computing system observes a change in a category with an average level of contamination in a usual circumstance. A usual circumstance refers to a situation where no massive inexplicable errors arise in a semiconductor manufacturing process. In another embodiment, to identify the root cause, the computing system dynamically distributes new monitoring wafers in the category with the highest level of contamination or in the category with the average level of contamination or in both categories. This dynamic distribution is an active (and automated) response to a variation in a semiconductor manufacturing process, as opposed to a passive observation and monitoring that sends the monitor wafer in a predetermined manner.

The following sets forth distribution names and notations used in the description herein below:

1) Probability of a distribution (e.g., a Poisson distribution, Bernoulli distribution) is denoted by P.
2) Expected Value of the distribution is denoted E. Variance of the distribution is denoted $D^2$
3) A random variable with Poisson Distribution of parameter $\lambda$ will be denoted Poiss($\lambda$), i.e., if X is equal to Poiss($\lambda$) or X is close to Poiss($\lambda$),
4) then $$P(X = k) = e^{-\lambda}\frac{\lambda^k}{k!} \quad (1)$$

(k is an integer number, X is a random variable number)
5) A random variable with Bernoulli (Binomial) Distribution of parameter p and N will be denoted Bern (p, N), i.e., if X is equal to Bern (p, N) or X is close to Bern (p, N), then $$P(X = k) = \binom{N}{k}p^k(1-p)^{N-k} = \frac{N!}{k!(N-k)!}p^k(1-p)^{N-k} \quad (2)$$

In the description herein below, the following is given as input or assumed:

A sequence of wafers is passing through a semiconductor manufacturing tool and/or chamber.

Each wafer leaves some FP (foreign particles) in the semiconductor manufacturing tool and/or chamber.

The FP already in the tool sediments on passing wafers.

At various times, a monitoring wafer is sent through the tool and/or chamber.

The computing system can observe the FP sedimentation on surfaces of the monitor wafers.

If FM on the monitoring wafer is higher than a threshold, the tool and/or chamber is cleaned.

As mentioned herein above, the computing system determines the highest contamination category, e.g., by solving best fit problems (e.g., Least Square method and Maximum Likelihood method). After identifying the highest contamination category, e.g., by solving the "best fit" type problem, the computing system finds the root cause of foreign material contamination, e.g., by distributing new monitoring wafers in the category with the highest level of contamination or in the category with the average level of contamination or in both categories.

The following conditions are further assumed:

The FP levels on monitoring wafers represent the levels of contamination in the semiconductor manufacturing tools/chambers at respective time moments.

The effects of passing monitoring wafers on the level of FP in the semiconductor manufacturing tool/chamber are cumulative:

The number of FP added by the monitoring wafers is independent.

The number of FP carried away from the semiconductor manufacturing tool/chamber (hereinafter called "self-cleaning") may depend on the number of FP in the semiconductor manufacturing tool/chamber, otherwise the number of FP are independent.

The cleaning done after observing the threshold violation (i.e., the number of FP on a monitoring wafer is larger than a threshold) on monitoring wafers is perfect.

In one embodiment, the computing system partitions wafers into categories. The computing system defines the categories according to semiconductor manufacturing tools used for the wafers. Each foreign particle (either entering or leaving the semiconductor manufacturing tools/chambers) is an independent item. The number of foreign particles left by the wafers as a result of being processed is an independent random variable with a distribution (or mean value) defined by the categories. The number of foreign particles carried away as a result of performing a self-cleaning is an independent random variable with a distribution (e.g., Bernoulli distribution) defined by the number of foreign particles in the semiconductor manufacturing tools/chambers. Self-cleaning is a non-technical term to describe diminishing of the number of foreign particles in a semiconductor manufacturing tool, e.g., by sheer moving of the wafers in and out of the tool which produces an exchange of a tool atmosphere.

The computing system determines which category of the wafers is expected to leave the highest foreign particles. Given categories, the computing system solves best fit problems, e.g., Least Square method and Maximum Likelihood method. The computing system finds the means (i.e., average number of foreign particles) and/or self-cleaning rate (i.e., how many foreign particles are removed per self-cleaning) of each category. The computing system chooses a category with the highest means (i.e., the highest contamination category).

The computing system finds the root cause of foreign particles on the monitoring wafers and/or semiconductor manufacturing tools/chambers, e.g., by searching the highest contamination category in the dramatic circumstance, by observing changes in the average number of foreign particles in the usual circumstance, and distributing monitoring wafers in a particular category.

The computing system models or estimates the level of contamination in a semiconductor tool, e.g., by using $C(t)=\text{Bern}(C(t-1), p)+\text{Poiss}(\lambda(t))$, where $C(t)$ represents the level of contamination and/or the number of particles in a semiconductor manufacturing tool at time t. Bern( ) represents a Bernoulli distribution depending the number of foreign particles. p represent an intensity of self cleaning i.e. the probability that a potential contaminant will leave a particular tool/chamber. Poiss( ) represents a Poisson distribution of the foreign particles introduced to a wafer by the semiconductor manufacturing tool/chamber. $\lambda(t)$ represents an unknown parameter of the contamination for the semiconductor manufacturing tool at a time t.

In other words, let Num(t) be Bern(Cont(t−1),CleanRate), i.e.,

Num(t)=Bern(Cont(t−1),CleanRate), where Num(t) represents the number of foreign particles after self-cleaning at time t. Cont(t−1) represents the level of contamination at time t−1. CleanRate represents self-cleaning rate.

Let Cont(t) be Num(t)+Poiss($\lambda$(Cat (t))), i.e., Cont(t)=Num (t)+Poiss ($\lambda$(Cat (t))), where Cont(t) represents the level of contamination at time t. Num(t) represents the number of foreign particles at time t. Cat(t) represents a category of wafers. $\lambda$(Cont(t)) represents an unknown parameter of the contamination in the category.

If Cont(0) is equal to zero, then Cont(t) is close to Poiss($\mu$(t)), where $$\mu(t) = \sum_{0 < s \leq t} p^{t-s} \lambda(s) \quad (3)$$

In the formula (3), s is an index variable representing a semiconductor manufacturing step in a semiconductor manufacturing tool. In order to emphasize a dependence of $\mu$ on p and $\lambda$, the computing system may consider $\mu(p, \lambda)$ as a same quantity of $\mu(t)$. The computing system may consider can use $\mu(t)$ as a definition of $\mu(t; p, \lambda)$.

At a time moment $t_M$, the computing system observes $C(t_M)$, the number of foreign particles on a monitoring wafer at a time moment $t_M$. Given a threshold T, if $C(t_M)$ is larger than T, then the computing system assigns zero to $C(t_M)$ after cleaning the semiconductor manufacturing tool/chamber used to manufacture the monitoring wafer between prior cleaning and the present time. If there is no change in the number of foreign particles on the monitoring wafer, the computing system observes unchanged $C(t_M)$.

In one embodiment, the computing system constructs the parameter $\lambda$ (i.e., the mean/average number of foreign particle in a category) using LS method. Given $C(t_M)$, the computing system constructs $\lambda$(Cat), which represents unknown parameters (e.g., the average number of foreign particles) of categories. In LM method, the computing system treats $C(t_M)$ as an estimator of $\mu(t_M)$. $\mu(t_M)$ represents a parameter of a distribution for monitoring wafers.

$$C(t_M) = \sum_{t'_M < s \leq t_M} p^{t_M - t'_M - s} \lambda(s),$$

where s is an index variable representing a semiconductor manufacturing step in a semiconductor manufacturing tool, $\lambda(s)$ represents a parameter (e.g., the average number of foreign particles) for each semiconductor manufacturing step. $t_M$ represents a time moment at which a self-cleaning occurred. Alternatively, $$C(t_M) = C(t''_M) p^{t_M - t''_M} + \sum_{t''_M < s \leq t_M} p^{t_M - t''_M - s} \lambda(s),$$

where $t''_M$ represents a time moment at which a self-cleaning occurred. Then, according to LS method, the best fit is to find $$\min F(p, \lambda) = \min_{\lambda, p} \sum_i \left( C(t_{M_i}) - \sum_{t_{M_{i-1}} < s \leq t_{M_i}} p^{t_{M_i} - t_{M_i} - s} \lambda(s) \right)^2 \quad (4)$$

where i is an index variable which counts the number of monitor wafers. LS method minimizes the function F (i.e., the formula (4)—the sum of squares of differences) over a set of p and $\lambda$. Then, such p and $\lambda$ may represent a model fit to observations of monitoring wafers. For any p, LS method finds the model given values of $\mu(t_M)$. Then, LS method chooses p with a least error of an estimation, e.g., p with minimal $L^2$ error. $L^2$ error is a usual Euclidean norm or distance that is the square root of sum of squares of differences.

In another embodiment, the computing system constructs the parameter $\lambda$ using ML method. Given $C(t_M)$, the computing system can constructs $\lambda$(Cat) by using ML method. In ML method, the computing system treats $C(t_M)$ as a result and attempts to fit $p(t_M)$ to maximize a probability in Poisson distribution:

$$P(Poiss(\mu) = C(t \mid \lambda, p)) = e^{-\mu(\lambda, p)} \frac{\mu(\lambda, p)^{C(t)}}{C(t)!},$$

where C(t) represents the number of foreign particles on a monitoring wafer at a time t.

$$P(Poiss(\mu_1) = C_{t_{M_1}}, Poiss(\mu_2) = C_{t_{M_2}}, Poiss(\mu_3) = C_{t_{M_3}}, \ldots ,$$

$$Poiss(\mu_m) = C_{t_{M_m}}) = \prod_{1 \leq i \leq m} e^{-\mu_i} \frac{\mu_i^{C_{t_{M_i}}}}{C_{t_{M_i}}!}$$

where $\Pi$ denotes the product of a sequence of numbers in the similar way as $\Sigma$ denotes the sum. According to ML method, the computing system calculates the maximum of the function $$F(\lambda, p) = \sum_i \left( \mu_{t_{M_i}}(\lambda, p) + C(t_{M_i}) \ln(\mu_{t_{M_i}}(\lambda, p)) \right) + const \quad (5)$$

where i is an index variable. For any p, the computing system finds the best fit of $\lambda$, i.e., $\lambda$ that maximizes the function (5) when given $C(t_M)$. Then, the computing system chooses p with a maximal likelihood, i.e., p that maximizes the function (5) when given $C(t_M)$.

As described above, the computing system finds the root cause of the highest contamination categories, e.g., by running method steps described in FIG. 2. The computing system orders the sequence of expected values $\lambda$(Cat) to the sequence $(\lambda_1, \ldots, \lambda_N)$. For each k=1, . . . , N, the computing system splits this ordered sequence into two groups: lower and upper parts. Then, the computing system calculates the first coefficient according to the step 210 in FIG. 2 as described above. The computing system compares the first coefficient to the reference coefficient and finds the variable k with the largest deviation between these two coefficients. The number k separates the $\lambda$s into two groups, "L" and "U". The $\lambda$s in the group "L" are rather innocent in the contamination while the $\lambda$s in the group "U" are prime suspects to introduce more contamination. Analyzing the $\lambda$s in "U," the computing system may separate tools which appear in their usage history to identify particular tools to be investigated. The investigated tools may be a common cause for contamination.

Following describes a usage scenario according to one embodiment.

1. Assume that there is a finite set C of categories. The number of elements in C is equal to K+1, i.e., #C=K+1. A category maybe defined by a history, i.e., a passage of the wafers through the same sequence of tools.
2. Assume that for each class/category there is a positive number $\lambda_c$, c=0, ..., K. $\lambda_c$ represents a parameter (e.g., mean/average value) of a Poisson distribution.
3. Assume that there is a known sequence of objects (e.g., wafers with a given history including monitoring wafers) $S_t$, which pass through a semiconductor manufacturing tool and/or chamber in the semiconductor manufacturing tool.
4. The computing system models the level of contamination in the tool and/or chamber. At a time moment t, the object of category c enters the tool and/or the chamber and introduces a number $X_t$ of contaminants. $X_t$ is a random variable with Poisson distribution, Poiss($\lambda_{c(t)}$). After the chamber/tool is partially cleaned, each contamination particle has a probability p (same for all foreign particles, all classes/categories and all times) to stay in the tool and/or chamber and (I-p) to leave it. Each foreign particle is treated as independent.
5. This modeling results in $C_t$, the number of foreign particles in the tool/chamber at time t, such that:
    5.1. $C_{t+1}$=Bern (p, $C_t$-$X_t$), where Bern( ) represents a Bernoulli distribution.
    5.2. If $C_0$ is equal to 0, then $C_t$ has Poisson distribution with a parameter:
    5.3.

$$\tilde{\mu}_t = \sum_{k=0}^{t-1} \lambda_{c(k)} p^{t-k},$$

where k is an index variable, $\lambda_{c(k)}$ represents an average level of contamination in a class/category c(k). $p^{t-k}$ represents a probability of the contamination in the tool and/or chamber between a time moment k to the time moment t. $\tilde{\mu}_t$ represents an estimation of $\mu_t$, which represents a parameter of a distribution of monitoring wafers.

6. Whenever the current level of contamination b is larger than a threshold $b_0$, the tool and/or chamber is forced to be externally cleaned. Then, b is reset to 0.
7. Whenever c(t) is equal to zero, i.e., whenever the first set of monitoring wafers enters the tool and/or chamber, the computing system measures b, e.g., through a sensor/detector, to estimate the current level of contamination. From the second set of monitoring wafers, the computing system assumes that b=$C_t$+$X_t$. Thus, the computing system or a user observes the effect of accumulated contamination before the self-cleaning, e.g., through a sensor, detector and/or microscope. Similarly before the computing system measures b at the time moment t, i.e., $S_t$=$C_0$, b demonstrates a Poisson distribution with a parameter $$\mu_t = \sum_{k=0}^{t} \lambda_{c(k)} p^{t-k}.$$

Note that this summation $$\left(\sum_{k=0}^{t} \lambda_{c(k)} p^{t-k}\right)$$

runs from 0 to t and that the last term has p with a zero exponent.

8. By knowing b and the sequence $S_t$, the computing system estimates $\lambda$ and p in such a way that:
    8.1. The order of estimated $\hat{\lambda}_c$ (i.e., parameters calculated from monitoring wafers which stand for true parameters of the model) best fits the order of $\lambda_c$.
    8.2. Alternatively, the classification of $\hat{\lambda}_c$ into two subgroups (e.g., low ("L") and high ("U")) correspond the best to such classification of $\lambda$.
    8.3. Furthermore, if $\hat{\lambda}_c$ cannot be classified, the computing system establishes that $\lambda$ cannot be ordered (or classified) in a statistically significant way. A statistical significance is determined by a probability that a corresponding event has not happened. Thus, If "P" refers to a probability that the event has occurred so far, a larger value of "P" (e.g., "P"=0.8) corresponds to a small value of the statistical significance (e.g., statistical significance=1−0.8=0.2).
9. Following describes that how the computing system estimates $\lambda$ and p in detail.
    9.1. Search over all p.
    9.2. A dependence on $\mu$ (estimated from b) from $\lambda$ is linear. The dependence on $\mu$ from p is a polynomial expression (e.g., $4^{th}$ or $5^{th}$ degree polynomial). The computing system estimates $\lambda$ for each p separately and then search for the best p.
    9.3. For a fixed p, the computing system searches for the best LS fit of $\lambda$. In other words, the computing system solves the following problem.
    9.4. Let $b_j$ describe the contamination level of the j-th monitor wafer and $t_j$, the time (measured in number of wafers) between the j-th monitor wafer and previous cleaning. Then, according to the best LS fit model, the computing system expects $$b_j = \sum_{s=1}^{t_j} \lambda_{c(s)} p^{t_j-s}.$$

9.5. For a fixed p, the LS method also finds best fit $\lambda$ by minimizing $$\sum_j \left(b_j - \sum_{s=1}^{t_j} \lambda_{c(s)} p^{t_j-s}\right)^2$$

that is solving K+1 linear equations, where c=0, ..., K and $$\sum_j \left(\left(b_j - \sum_{s=1}^{t_j} \lambda_{c(s)} p^{t_j-s}\right) \cdot \sum_{c(s)=c} p^{t_j-s}\right) = 0.$$

9.6. While solving the K+1 linear equations, e.g., by using a standard QR method, the computing system finds $\lambda$ when there is a unique solution. Specifically, the computing system finds Least Square fit (i.e., a $\lambda$ with minimal $L^2$ error; $L^2$ error is a usual Euclidean norm or distance that is the square root of sum of squares of differences) if there is no solution. The computing system finds a solution (i.e., a λ with minimal length, e.g., a λ whose $L^2$ error is close to zero) if there is an affine subspace of solutions. Upon finding a best fit (i.e., best solution) λ, the LS method classifies and/or orders the λs according to the degree of the best fit (e.g., an $L^2$ error of each λ). QR method refers to a known procedure to compute an eigenvalue or eigenvector of a matrix.

9.7. Instead of using LS method, the computing system can use ML method to estimate p and λ. In ML method, the computing system finds λ that maximizes $$\sum_j (-\mu_j + b_j \log \mu_j + \log b_j) \quad (6)$$

where $\mu_j$ is equal to $$\sum_{s=1}^{t_j} \lambda_{c(s)} p^{t_j - s}$$

9.8. The maximization problem (6) leads to following K+1 non-linear equations, where c=0, ..., K:

$$\sum_j \left( \sum_{c(s)=c} p^{t_j - s} \left( -1 + \frac{b_j}{\sum_{s=1}^{t_j} \lambda_{c(s)} p^{t_j - s}} \right) \right) = 0 \quad (7)$$

9.9. The computing system can solve the formula (7), e.g., by using generalized linear model (GLM). GLM is a modeling technique that allows models to be fit to data that follow a probability distribution other than Normal distribution, e.g., Poisson, Binomial, Bernoulli, etc. Nicholas J. Horton, "Maximum Likelihood Analysis of Generalized Linear Models with Missing Covariates", Statistical Methods in Medical Research, 1998, wholly incorporated by reference as if set forth herein, describes GLM in detail. The computing system performs a calculation(s) and/or runs logic that evaluates a property (e.g., $L^2$ error) of each solution (e.g. each λ), e.g., in a statistical way, to find the best fit (i.e., best solution) λ.

Figure 3:
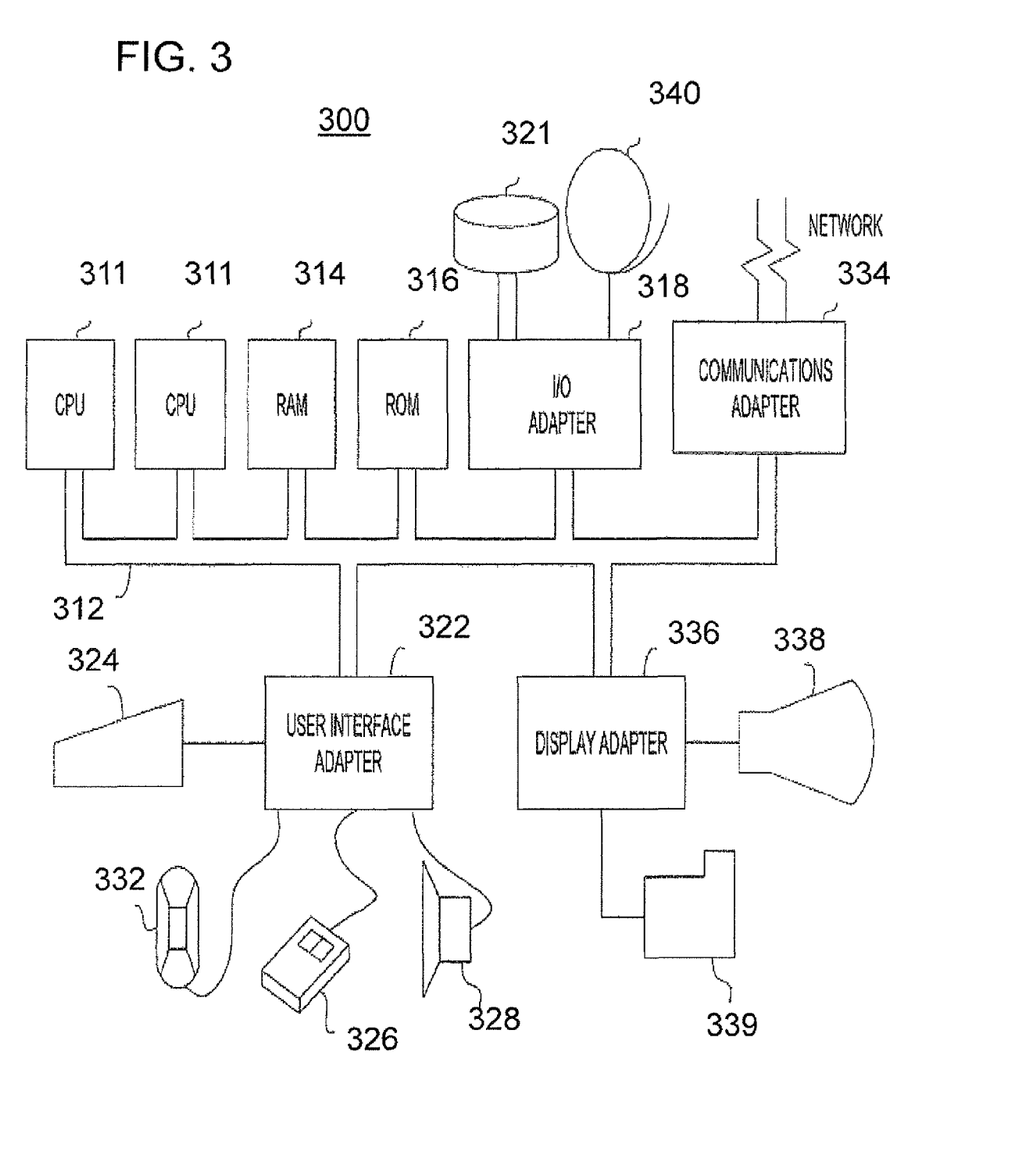
FIG. 3 illustrates an exemplary hardware configuration for implementing the flow charts depicted in FIGS. 1-2 according to one embodiment.

FIG. 3 illustrates an exemplary hardware configuration of a computing system 300 running and/or implementing the method steps in FIGS. 1-2. The hardware configuration preferably has at least one processor or central processing unit (CPU) 311. The CPUs 311 are interconnected via a system bus 312 to a random access memory (RAM) 314, read-only memory (ROM) 316, input/output (I/O) adapter 318 (for connecting peripheral devices such as disk units 321 and tape drives 340 to the bus 312), user interface adapter 322 (for connecting a keyboard 324, mouse 326, speaker 328, microphone 332, and/or other user interface device to the bus 312), a communication adapter 334 for connecting the system 300 to a data processing network, the Internet, an Intranet, a local area network (LAN), etc., and a display adapter 336 for connecting the bus 312 to a display device 338 and/or printer 339 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for detecting foreign particles in a semiconductor manufacturing process, the manufacturing process using a plurality of semiconductor manufacturing tools, the method comprising:
    categorizing at least one monitoring wafer according to one or more categories;
    supplying the categorized monitoring wafer to a semiconductor manufacturing tool;
    observing a level of contamination on the categorized monitoring wafer;
    comparing the level of contamination to a threshold;
    cleaning the tool in a response to determining that the level of contamination is larger than the threshold;
    determining which category of the categorized monitoring wafer leaves a highest level of contamination on the tool; and
    identifying, based on the determined category, a root cause of the highest level of contamination on the tool,
    wherein a processor performs one or more of: the categorizing, the supplying, the observing, the comparing, the cleaning, the determining, and the identifying.

2. The method according to claim 1, wherein the level of contamination on the monitoring wafer represents a number of foreign particles on the tool.

3. The method according to claim 1, wherein a category of a monitoring wafer is determined by semiconductor manufacturing tools used.

4. The method according to claim 1, wherein the determining the highest contamination category includes solving best fit problems.

5. The method according to claim 1, wherein the identifying includes:
    searching for a category with the highest level of contamination in a dramatic circumstance;
    observing a change in a category with an average level of contamination in a usual circumstance; and
    distributing new monitoring wafers in the category with the highest level of contamination or in the category with the average level of contamination or in both categories.

6. The method according to claim 1, further comprising:
    modeling the level of contamination on the tool.

7. The method according to claim 2, wherein the foreign particles are observed by a microscope.

8. The method according to claim 4, wherein the best fit problems include one or more of: Least Square method and Maximum Likelihood method.

9. The method according to claim 4, wherein a solution of the best fit problems classifies parameters of the level of contamination of the tool.

10. The method according to claim 6, further comprising:
    using at least one statistical distribution to create the model.

11. The method according to claim 9, further comprising:
    dividing the parameters into two groups according to a variable;
    calculating a first coefficient based on the variable and a number of the parameters;
    comparing the first coefficient with a reference coefficient;
    evaluating whether the variable generates a largest deviation between the first coefficient and the reference coefficient; and
    deciding that the two groups is a best classification of the parameters in a response to determining that the variable generates the largest deviation.

12. The method according to claim 10, wherein the statistical distribution includes one or more of: Poisson distribution and Bernoulli distribution.

13. A system for detecting foreign particles in a semiconductor manufacturing process, the manufacturing process using a plurality of semiconductor manufacturing tools, the system comprising:
    a memory device;
    a processor connected to the memory device;
    the processor performs steps of:
        categorizing at least one monitoring wafer according to one or more categories;
        supplying the categorized monitoring wafer to a semiconductor manufacturing tool;
        observing a level of contamination on the categorized monitoring wafer;
        comparing the level of contamination to a threshold;
        cleaning the tool in a response to determining that the level of contamination is larger than the threshold;
        determining which category of the categorized monitoring wafer leaves a highest level of contamination on the tool; and
        identifying, based on the determined category, a root cause of the highest level of contamination on the tool.

14. The system according to claim 13, wherein the level of contamination on the monitoring wafer represents a number of foreign particles on the tool.

15. The system according to claim 13, wherein a category of a monitoring wafer is determined by semiconductor manufacturing tools used.

16. The system according to claim 13, wherein the determining the highest contamination category includes solving best fit problems.

17. The system according to claim 13, wherein the identifying includes:

searching for a category with the highest level of contamination in a dramatic circumstance;

observing a change in a category with an average level of contamination in a usual circumstance; and distributing new monitoring wafers in the category with the highest level of contamination or in the category with the average level of contamination or in both categories.

18. The system according to claim 13, wherein the processor further performs step of:

modeling the level of contamination on the tool.

19. The system according to claim 14, wherein the foreign particles are observed by a microscope.

20. The system according to claim 16, wherein the best fit problems includes one or more of: Least Square method and Maximum Likelihood method.

21. The system according to claim 16, wherein a solution of the best fit problems classifies parameters of the level of contamination of the tool.

22. The system according to claim 18, wherein the processor further performs step of:

using at least one statistical distribution to create the model.

23. The system according to claim 21, the processor further performs steps of:

dividing the parameters into two groups according to a variable;

calculating a first coefficient based on the variable and a number of the parameters;

comparing the first coefficient with a reference coefficient;

evaluating whether the variable generates a largest deviation between the first coefficient and the reference coefficient; and deciding that the two groups is a best classification of the parameters in a response to determining that the variable generates the largest deviation.

24. The system according to claim 22, wherein the statistical distribution includes one or more of: Poisson distribution and Bernoulli distribution.

25. A computer program product for detecting foreign materials in a semiconductor manufacturing process, the manufacturing process including a plurality of semiconductor manufacturing tools, the computer program product comprising a storage medium readable by a processing circuit and storing instructions run by the processing circuit for performing a method, the method comprising:

categorizing at least one monitoring wafer;

supplying the categorized monitoring wafer to a semiconductor manufacturing tool;

observing a level of contamination on the monitoring wafer;

comparing the level of contamination to a threshold;

cleaning the tool in a response to determining that the level of contamination is larger than the threshold;

determining which category of the categorized monitoring wafer leave a highest level of contamination on the tool; and identifying, based on the determined category, a root cause of the highest level of contamination on the tool.

* * * * *